United States Patent
Siu

(10) Patent No.: US 6,664,617 B2
(45) Date of Patent: Dec. 16, 2003

(54) SEMICONDUCTOR PACKAGE

(75) Inventor: Wing Ming Siu, Kowloon (HK)

(73) Assignee: Convergence Technologies, Ltd. (HK)

( * ) Notice: Subject to any disclaimer, the term of this patent is extended or adjusted under 35 U.S.C. 154(b) by 0 days.

(21) Appl. No.: 10/015,647

(22) Filed: Dec. 17, 2001

(65) Prior Publication Data

US 2002/0074636 A1 Jun. 20, 2002

Related U.S. Application Data

(60) Provisional application No. 60/325,745, filed on Dec. 19, 2000.

(51) Int. Cl.[7] .................. H01L 23/495; H01L 23/34
(52) U.S. Cl. .................. 257/669; 257/675; 257/724
(58) Field of Search .................. 257/669, 675, 257/706, 724, 723, 788, 678

(56) References Cited

U.S. PATENT DOCUMENTS

| | | | |
|---|---|---|---|
| 5,409,865 A | | 4/1995 | Karnezos |
| 5,561,323 A | * | 10/1996 | Andros et al. ............... 257/707 |
| 5,583,377 A | | 12/1996 | Higgins, III |
| 5,783,870 A | | 7/1998 | Mostafazadeh et al. |
| 5,939,781 A | | 8/1999 | Lacap |
| 6,011,694 A | | 1/2000 | Hirakawa |
| 6,032,355 A | | 3/2000 | Tseng et al. |
| 6,072,233 A | * | 6/2000 | Corisis et al. ............... 257/686 |

FOREIGN PATENT DOCUMENTS

| | | | |
|---|---|---|---|
| JP | 8078584 | | 3/1996 |
| JP | 8250625 | | 9/1996 |
| JP | 10163387 | * | 6/1998 |
| JP | 10247702 | | 9/1998 |
| JP | 11126803 | | 5/1999 |
| JP | 11-176975 | | 7/1999 |
| WO | WO 99/44233 | | 9/1999 |

* cited by examiner

*Primary Examiner*—Amir Zarabian
*Assistant Examiner*—Kiesha Rose
(74) *Attorney, Agent, or Firm*—Fish & Richardson P.C.

(57) ABSTRACT

A semiconductor package includes a metallic foil (10) having a front surface and a rear surface, which foil (10) is formed to have a recess portion (12) including a bottom and an extended border region (14) around the recess portion (12). A substrate (30) is attached to the front surface of the foil (10) over the border region (14) to provide a support for electrical connection of a semiconductor element (40). The substrate (30) has an opening exposing the recess portion (12). A stiffener (20) is formed on the rear surface of the foil (10) for enhancing the rigidity of the foil (10). The stiffener (20) extends over the border region (14) and around the recess portion (12), with the rear surface of the bottom of the recess portion (12) exposed for heat dissipation. A semiconductor element (40) is mounted on the bottom of and within the recess portion (12).

5 Claims, 5 Drawing Sheets

SEMICONDUCTOR PACKAGE

CROSS REFERENCE TO RELATED APPLICATIONS

This application claims priority under 35 USC §119(e) to U.S. patent application Ser. No. 60/325,745, filed on Dec. 19, 2000, the entire contents of which are incorporated by reference.

TECHNICAL FIELD

This invention relates to a semiconductor package for multi-chip and three-dimensional configurations and a method of making the same.

BACKGROUND

Packaging is the process in which semiconductor is enclosed for protection and to provide ease of handling and usage. Common techniques for enclosing semiconductor include encapsulation and glob-top. In both of these methods, the semiconductor is covered with a polymer, which, however, has the side effects of trapping heat and raising the stress within the package. In certain cases, the stress within the package can be sufficient to crack the semiconductor or give rise to delaminations at various locations within the package. In addition, the trapped heat can cause thermally induced failures.

Thus, most packaging technologies seek to accomplish a high heat transfer rate while minimizing the stress that can build up internally. This is particularly important as the trend for miniaturization further pushes the level of integration for many semiconductors and has increased the demand on heat removal and space usage.

One way to increase the heat transfer from the semiconductor is by directly mounting it onto a metallic heat-spreader. The TBGA and the superBGA packages are popular configurations that seek to employ this concept. Others have sought to improve on the space requirement of these two packages by proposing to stack them on top of each other so as to produce a three-dimensional structure. As the TBGA, superBGA and other similar packages require a rigid heat-spreader, a high stress level can be generated within the packages.

SUMMARY

A semiconductor package includes a thin, flexible metallic foil as a heat spreader and/or a grounding/electrical plane. The thin, flexible metallic foil may be etched, stamped, formed, or generally processed to yield circuitry patterns. The foil is also folded to yield an indentation, which can be formed through a number of techniques whether mechanical or chemical, and its shape can be rectangular or otherwise.

In one general aspect, circuitries are attached to either one or both sides of the foil. Such circuitries are well known in the art and can take the forms of a polyamide tape with metallization, a BT resin with metallization, or any other similar forms. There are also numerous ways to form these circuitries together with the foil as a single substrate. Some examples of these methods are disclosed herein, although this invention is not confined to those examples.

Electrically conductive paths can also be formed between the circuitries on the two sides of the foil, as discussed later. In one implementation, electronic devices, whether in packaged or unpackaged form, are mechanically, chemically, and/or electrically attached to the inside of the indentation and/or to the other side of the substrate. Such electronic devices are then covered using a polymer for protection. Such covering process is well known in the art and can take the form of a glob-top, encapsulation, or similar processes. Part of the foil can be exposed during the polymer covering process. Such exposed foil serves to provide a heat path.

In one implementation, the subject package functions as a Multi-Chip-Module (MCM). In yet another implementation, numerous MCM's are electrically and/or mechanically connected on top of one another in a three-dimensional stacked up structure. The electrical connections are made possible by electrically conductive paths formed into the polymer covering and the conduction paths formed between the circuitries on the two sides of the foil.

In another general aspect, a semiconductor package includes a metallic foil, a substrate, a stiffener, and a semiconductor element. The metallic foil has a front surface and a rear surface and is formed to have a recess portion including a bottom and an extended border region around the recess portion. The substrate is attached to the front surface of the foil over the border region to provide a support for electrical connection of a semiconductor element. The substrate has an opening exposing the recess portion. The stiffener is formed on the rear surface of the foil for enhancing the rigidity of the foil. The stiffener extends over the border region and around the recess portion, with the rear surface of the bottom of the recess portion exposed for heat dissipation. The semiconductor element is mounted on the bottom of and within the recess portion. The foil may have a material thickness less than 1 mm or in the range of 0.5 mm to 0.9 mm. The stiffener may include a polymer-based material.

In one implementation, the stiffener substantially fully occupies the space on the rear side of the border region and has an outer surface lying substantially flush with the rear surface of the bottom of the recess portion. The substrate may include a polyamide-based material or a BT based material. The substrate may be provided on at least its outer surface with a conductive layer in the form of a plurality of metal patterns for electrical connection of the semiconductor element. The conductive layer may be provided with a plurality of contact balls. The substrate may include at least one grounding via which extends through the substrate and has one end in contact with the foil. The foil and substrate may be formed in a single operation as a one-piece structure.

The semiconductor package may include a polymer filling the recess portion of the foil to enclose the semiconductor element and cover a rim portion of the opening of the substrate. The border region of the foil may be formed with at least one aperture, and an additional semiconductor element may be mounted on a rear surface of the substrate through the aperture and enclosed by the stiffener. The substrate may be provided on its outer surface with a conductive layer for electrical connection of the first-mentioned semiconductor element and on its inner surface with another conductive layer for electrical connection of the additional semiconductor element. The stiffener may include a plurality of conductive vias extending through it. In this case, the package may be stackable with another said semiconductor package to form a multi-layer package arrangement, with the conductive vias enabling grounding and/or thermal conduction between the metallic foils of the packages.

A multi-layer semiconductor package may be formed by at least two semiconductor packages, in which adjacent packages are interconnected by solder.

According to another aspect, a method of making a semiconductor package includes providing a metallic foil having a front surface and a rear surface, forming the foil to have a recess portion including a bottom and an extended border region around the recess portion, attaching a substrate to the front surface of the foil over the border region to provide a support for electrical connection of a semiconductor element, forming a stiffener on the rear surface of the foil to enhance the rigidity of the foil. The substrate has an opening to expose the recess portion and the stiffener extends over the border region and around the recess portion. The rear surface of the bottom of the recess portion is exposed for heat dissipation, and a semiconductor element is mounted on the bottom of and within the recess portion.

Forming the stiffener may include arranging the stiffener to substantially fully occupy the space on the rear side of the border region and to have an outer surface lying substantially flush with the rear surface of the bottom of the recess portion.

The method may include providing the substrate on at least its outer surface with a conductive layer in the form of a plurality of metal patterns for electrical connection of the semiconductor element. Forming the foil and attaching the substrate may be performed in a single operation to form the foil and substrate as a one-piece structure.

The method may include filling the recess portion of the foil with a polymer to enclose the semiconductor element and cover a rim portion of the opening of the substrate. The method may include forming at least one aperture in the border region of the foil, and mounting an additional semiconductor element on a rear surface of the substrate through the aperture. The method may further include providing the substrate on its outer surface with a conductive layer for electrical connection of the first-mentioned semiconductor element and on its inner surface with another conductive layer for electrical connection of the additional semiconductor element.

The method may include stacking at least the two semiconductor packages one on top of the other to form a multi-layer package arrangement, and providing grounding and/or thermal conductive paths between the metallic foils of adjacent packages. The method may include interconnecting adjacent packages by solder.

The semiconductor package offers a high thermal dissipation capability while maintaining a high degree of flexibility in semiconductor packaging, as well as the ability to accommodate a multitude of electronic devices and/or a three-dimensional stacking structure. The semiconductor package may function as a Multi-Chip-Module (MCM) thereby enabling an efficient utilization of physical geometry. Additionally, multiple packages (whether in single-chip and/or multi-chip configuration) may be functionally and/or mechanically stacked up together, thereby enabling a further more efficient usage of board space.

Other features and advantages will be apparent from the description, the drawings, and the claims.

DESCRIPTION OF DRAWINGS

Like reference symbols in the various drawings indicate like elements.

DETAILED DESCRIPTION

Figure 1A:
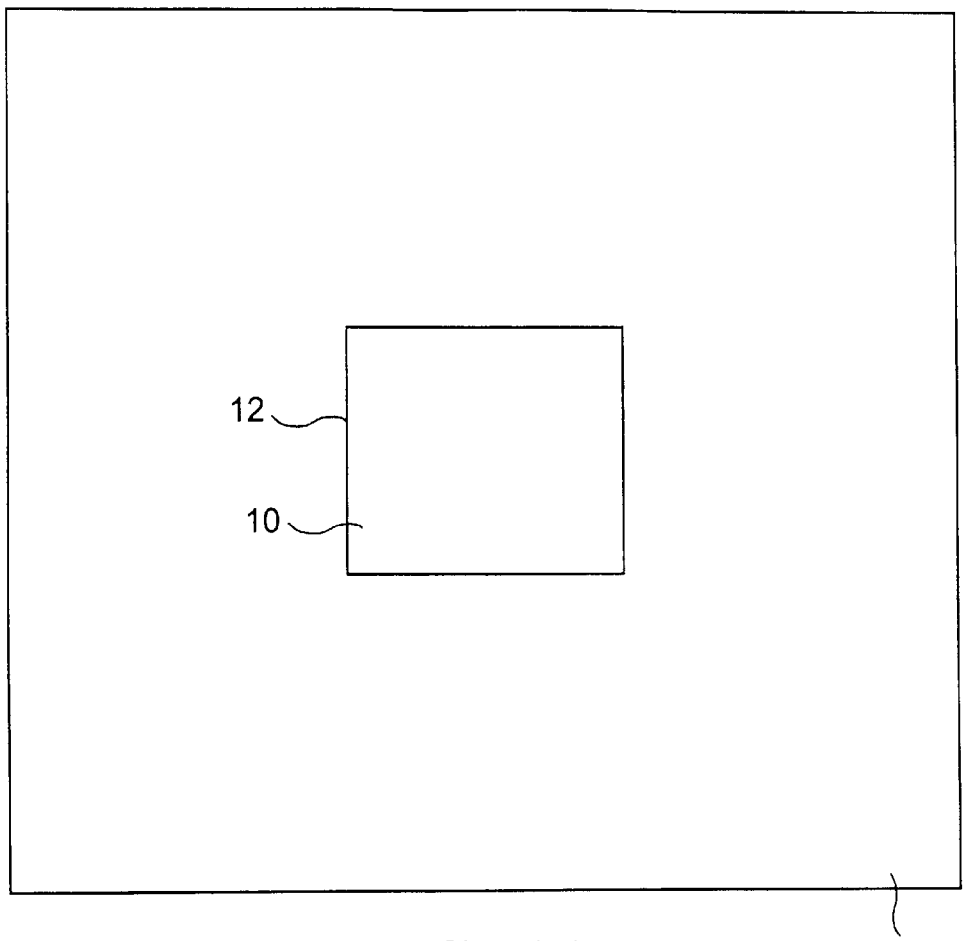
FIGS. 1A and 1B are top plan and cross-sectional side views of a first semiconductor package.
Figure 1B:
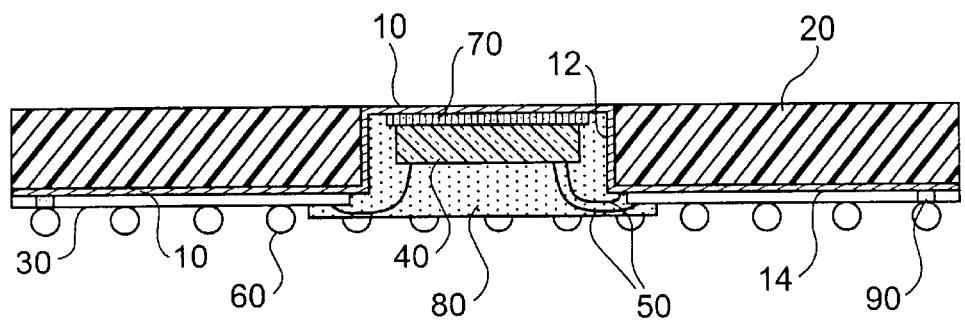

Referring to FIGS. 1A and 1B, a first semiconductor package includes a metallic or metal foil (10) for heat conduction and/or grounding purposes. The material thickness of the foil (10) is less than 1 mm and is preferably in the range of 0.5 mm to 0.9 mm. The foil (10) may have any suitable shape, but is shown to have a square or rectangular shape. The foil (10) is folded at the central portion to form a rectangular central recess (12) surrounded by a flat and extended border region (14).

The metal foil (10) is made of a material sufficiently thin to allow for mechanical folding, which can be accomplished through a number of techniques including but not limited to forming. To provide rigidity to the otherwise flexible foil (10), a stiffener (20) is provided to substantially fully occupy the space on the rear side of the border region (14) around the central portion of the foil (10) forming the recess (12). The outer surface of the stiffener (20) lies substantially flush with the rear surface of the bottom of the recess (12). The bottom surface remains uncovered or fully exposed for heat dissipation when a semiconductor device (40) is mounted onto the bottom of the recess (12) on the immediately opposite inner surface thereof.

The stiffener (20) may be made from a large range of materials including polymers and polymer mixtures. The stiffener may be attached using any suitable mechanical and/or chemical means. These are well known in the art, and for example, chemical attachment may be accomplished through adhesion. This adhesion may be accomplished through the explicit introduction of an adhesive agent, or as a result of curing the stiffener material.

A molded polymer may be used as the stiffener (20), and the folding operation upon the metal foil (10) may be performed by applying pressure to the metal foil (10) during the molding operation. In this way, both the folding of the foil (10) and the molding of the stiffener (20) may be performed in a single operation, with the two parts formed into shape as an integral or a one-piece structure.

An interconnecting substrate (30) is functionally attached to and covering the front surface of the border region (14) of the metal foil (10), which is formed with a central opening to expose the recess (12). The substrate (30) can be attached by a thermosetting, thermoplastic, or pressure-activated adhesive that may or may not be electrically conductive. Alternatively, this substrate (30) and the foil (10) can be manufactured together as one part, in which case the stiffening and folding operations involve the combined foil-substrate structure. Grounding vias (90) may extend through the substrate (30), each having one end in contact with the foil (10) to enable heat and/or electrical conduction through the substrate (30). The substrate (30) serves to provide a support for electrical connection, as described below.

A semiconductor device (40) is mounted into the central recess (12) of the metal foil (10) using an adhesive (70) that may or may not be electrically conductive. The adhesive (70) is well known in the art and can be a polymer, a polymer blend, an adhesive film or some form of solder.

The semiconductor device (40) has a plurality of bonding pads on its upper surface. These pads are functionally connected with the substrate (30) and the metal foil (10) using methods that are well known in the art. For example, connection may be achieved through wire bonding of metallic wires (50) or TAB bonding (not shown). A polymer (80) is then utilized to fill in the central recess (12) of the foil (10), which upon curing serves to cover or protect the semiconductor device (40), the connecting wires (50) and central rim portion of the substrate (30).

Figure 2A:
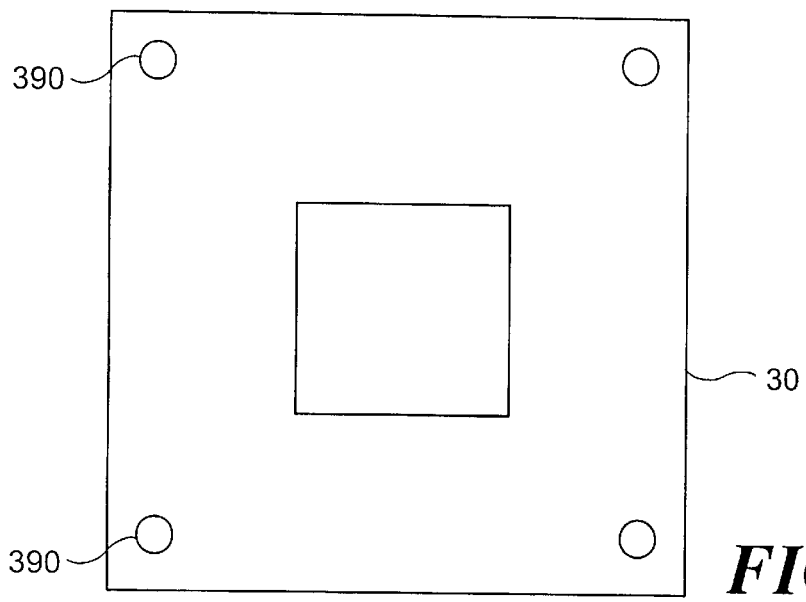
FIGS. 2A and 2B are top plan and cross-sectional side views of an interconnecting substrate for use in the package of FIG. 1A.
Figure 2B:
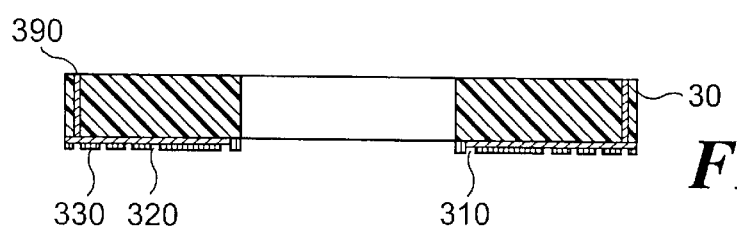

Referring also to FIGS. 2A and 2B, the interconnecting substrate (30), which is provided with a conductive layer in the form of a plurality of metal patterns, is utilized to route electrical signals from the semiconductor device (40) by solder contact spheres or balls (60) (FIG. 1B) to external electrical connections. The substrate (30) includes at least one such electrically conducting layer. Conducting vias (390) may exist to enable thermal/electrical conduction through the substrate.

In addition, both the top and the bottom sides of the substrate (30) may be electrically conducting, as in the case of plastic-ball-grid-array substrates generally known in the art. Such substrates have metal patterns and are, in general, made of polymers or polymer composites. In the case of a polymer, a polyamide material is commonly used. In the case of a polymer composite, a BT resin or a FR-4 material may be used. The formation of the metal patterns is typically accomplished by a combination of lamination, masking, drilling, deposition and etching processes.

Figure 2C:
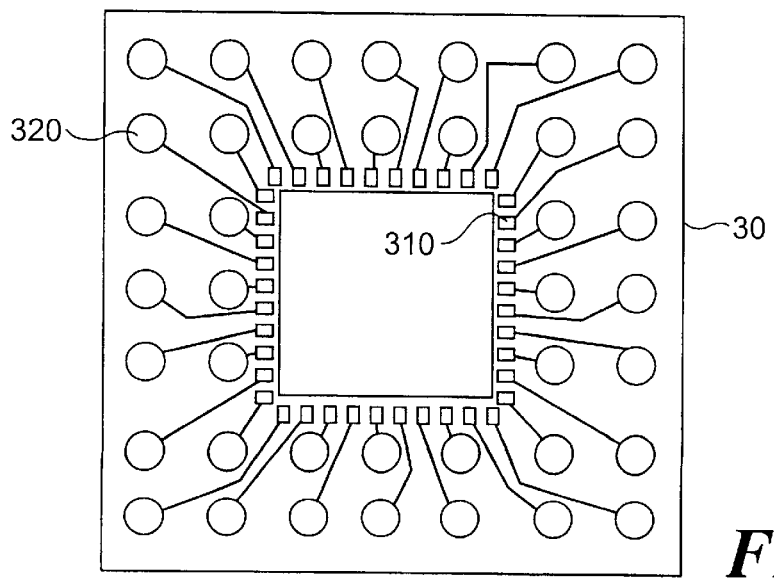
FIG. 2C is a bottom plan view of the substrate of FIGS. 2A and 2B, showing a typical metal pattern.

FIG. 2C shows the typical metal patterns at a bottom of the substrate (30) after a solder-mask (330) has been removed. The patterns typically include fingerleads (310) and bondpads (320). The fingerleads (310) are typically situated adjacent to and around the semiconductor device (40) and allow for electrical interconnections between the semiconductor device (40) and the substrate (30). The bondpads (320) are typically situated in an area-array pattern to allow functional interconnections with the solder balls (60).

The thin metallic foil (10) is utilized for its heat spreading/dissipating and electrical capabilities. Part of this foil (10) is exposed for heat transfer and/or electrical purposes, while the other portion is enclosed within a cured polymer (20), which provides the requisite rigidity for the package. This cured polymer (20) is sufficiently rigid for handling purposes, but on the other hand it is also sufficiently flexible to effectively reduce the stress within the package.

Figure 3A:
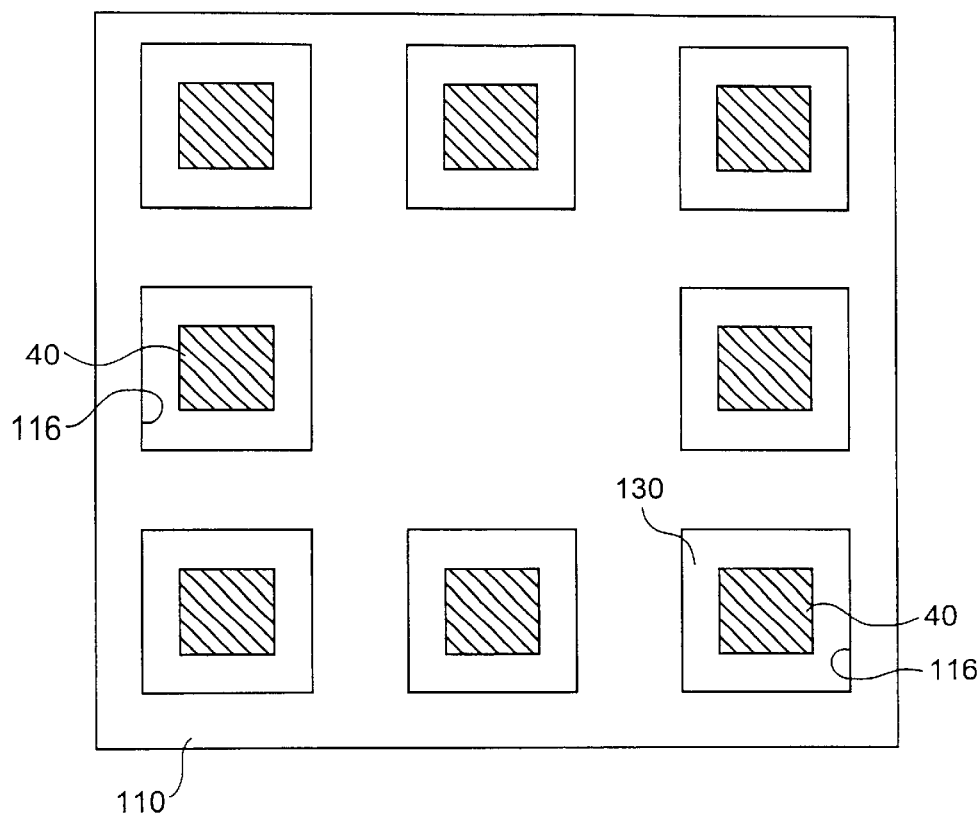
FIGS. 3A and 3B are top plan and cross-sectional side views of a second semiconductor package.
Figure 3B:
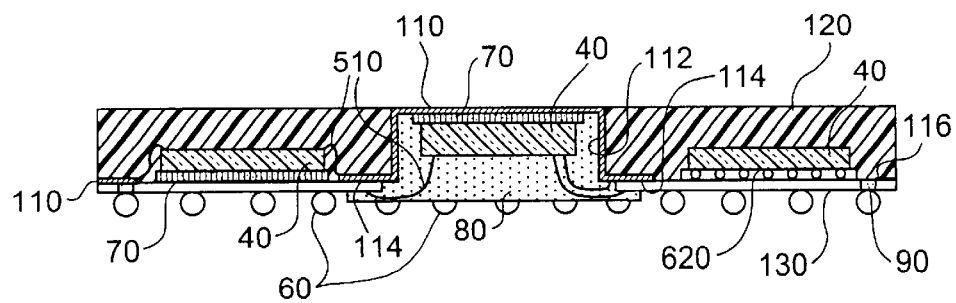

Referring now to FIGS. 3A and 3B, a second semiconductor package has a similar construction as the first package described previously. The second package is configured to accommodate a plurality of, for example, up to nine, semiconductor devices and/or passive components or, collectively, semiconductor elements (40) by employing a perforated or apertured metal foil (110) and a double-sided substrate (130) on the front side of the foil (110).

The metal foil (110), which is similar to the earlier foil (10) and is constructed in generally the same manner, has a central recess (112) and a border region (114) surrounding the recess (112). The major difference lies in the formation of eight rectangular side apertures (116) through the border region (114) as shown, which are arranged together with the central recess (112) into a 3×3 array.

The substrate (130), which can be made of materials similar to those as mentioned above in relation to the earlier substrate (30), is provided with a plurality of metal patterns on at least its top and bottom surfaces. The substrate (130) may include grounding vias (90) and is attached to the metal foil (110). The apertures (116) of the foil border region (114) define respective windows for eight semiconductor elements (40) to be held behind the substrate (130), and allow for functional attachments between these devices (40) and the substrate (130).

The metal foil (110) and the underlying substrate (130) can be manufactured as one unit, as described above. The functional connections between the substrate (130) and the eight semiconductor elements (40) can be accomplished through the use of electrically conductive films (not shown), solders (not shown), metallic wires (510), flipchip with underfills (620), or TAB bonding (not shown). Furthermore, the semiconductor elements (40) do not necessarily have to be in an unpackaged form and can, in fact, be in a chip-scale-package or even a wafer package.

After the eight semiconductor elements (40) have been attached, the above-mentioned folding and stiffening operations in relation to the metal foil (110) are performed so that all these devices (40) will be covered by stiffening material (120) on the rear side of the foil (110).

Another semiconductor element (40), which is usually the main one, is mounted into the central recess (112) of the metal foil (110). As discussed above, this element is functionally attached to the substrate (130) and covered by a cured polymer (80). Solder balls (60) may be attached to the bondpads (not shown) of this substrate.

Referring also to FIGS. 4A to 4D, a plurality of the above-described packages are stacked on top of one another to form a three-dimensional multi-layer structure. The stacking arrangement is made possible by reason of significant reduction in weight as achieved by replacing the conventional thick copper heat-spreader with a thin metallic foil and a polymer stiffener.

In each package of the stacked structure (FIG. 4B), a double-sided substrate (230) is utilized along with a perforated metal foil (210) reinforced by a correspondingly perforated stiffener (220). Electrically conductive vias (240) extend through the stiffener (220) at positions as required to enable functional interconnections between adjacent packages and, more specifically, adjacent foils (210) for grounding and thermal conduction. The vias (240) may be formed through a variety of processes as well known in the art, including, for example, masking, deposition, molding. Additional vias (90) are formed in the substrate (230) to provide the grounding and thermal paths between adjacent packages.

Figure 4A:
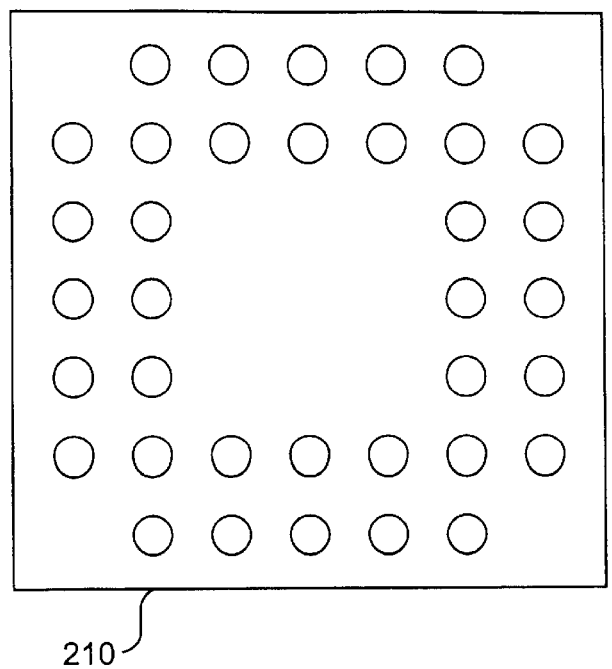
FIGS. 4A to 4D show a stacked structure formed by a plurality of semiconductor packages.
Figure 4B:
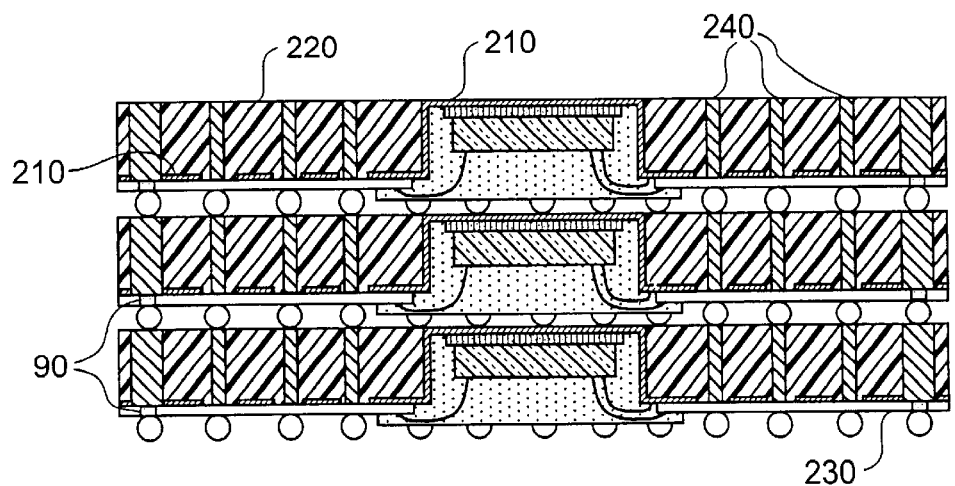
Figure 4C:
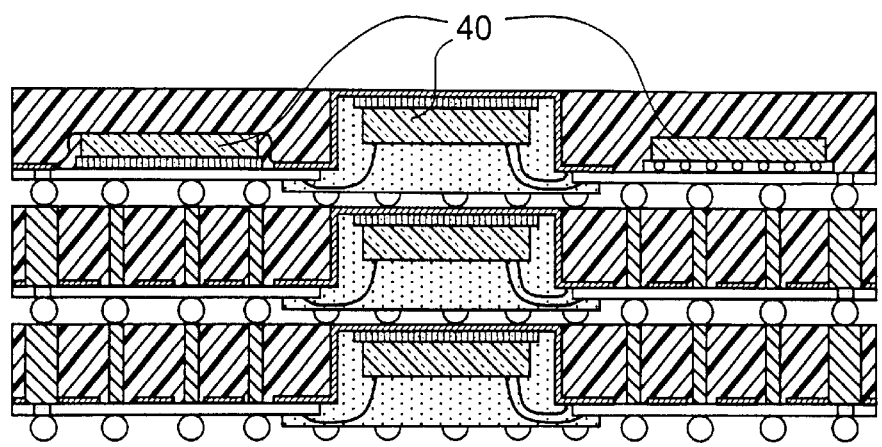
Figure 4D:
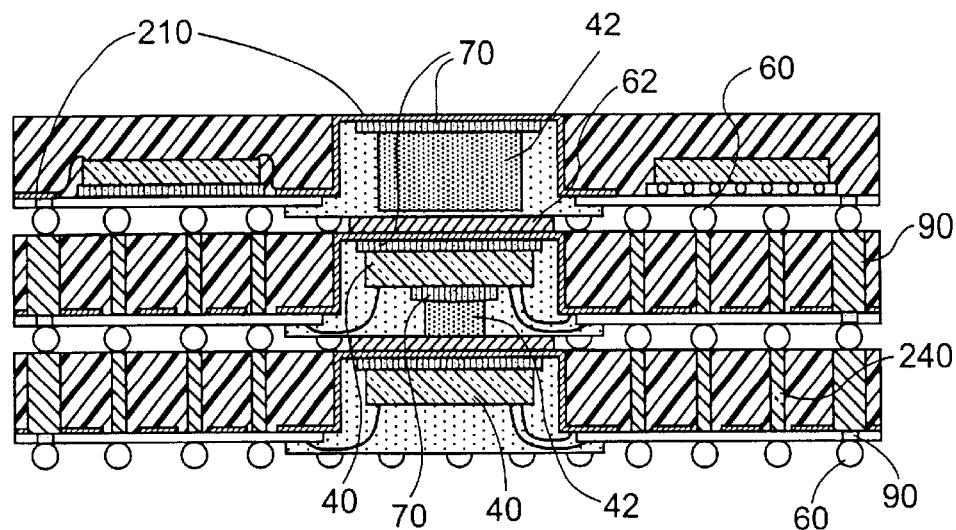

Each package in the three-dimensional structure may itself contain a large number of semiconductor elements (40), as in the case of the top layer of FIG. 4C. Passive components (42) may be incorporated into the packages (FIG. 4D), which can be mounted either directly on the metal foil (210) or on a semiconductor (40), with the use of a polymer (70) in-between for functional interconnection. A solder layer (62) is used for functional interconnection between the adjacent packages of each pair, and solder balls (60) are used for interconnecting the vias (240 and 90) aligned between adjacent packages to provide grounding and thermal paths there between.

Other implementations are within the scope of the following claims.

What is claimed is:

1. A semiconductor package comprising:
   a metallic foil having a front surface and a rear surface, the foil being formed to have a recess portion including a bottom and an extended border region around the recess portion;
   a substrate attached to the front surface of the foil over the border region to provide a support for electrical connection of a semiconductor element, the substrate having an opening exposing the recess portion;

a stiffener formed on the rear surface of the foil for enhancing the rigidity of the foil, the stiffener extending over the border region and around the recess portion;

wherein the rear surface of the bottom of the recess portion is exposed for heat dissipation, and a semiconductor element is mounted on the bottom of and within the recess portion; and wherein the border region of the foil is formed with at least one aperture, and an additional semiconductor element is mounted on a rear surface of the substrate through the aperture and enclosed by the stiffener.

2. The semiconductor package of claim 1, wherein the substrate is provided on its outer surface with a conductive layer for electrical connection of the first-mentioned semiconductor element and on its inner surface with another conductive layer for electrical connection of the additional semiconductor element.

3. A semiconductor package comprising:

a metallic foil having a front surface and a rear surface, the foil being formed to have a recess portion including a bottom and an extended border region around the recess portion;

a substrate attached to the front surface of the foil over the border region to provide a support for electrical connection of a semiconductor element, the substrate having an opening exposing the recess portion; and a stiffener formed on the rear surface of the foil for enhancing the rigidity of the foil, the stiffener extending over the border region and around the recess portion;

wherein the rear surface of the bottom of the recess portion is exposed for heat dissipation, and a semiconductor element is mounted on the bottom of and within the recess portion; and wherein the stiffener includes a plurality of conductive vias extending through it.

4. A semiconductor package comprising:

a metallic foil having a front surface and a rear surface, the foil being formed to have a recess portion including a bottom and an extended border region around the recess portion;

a substrate attached to the front surface of the foil over the border region to provide a support for electrical connection of a semiconductor element, the substrate having an opening exposing the recess portion;

a stiffener formed on the rear surface of the foil for enhancing the rigidity of the foil, the stiffener extending over the border region and around the recess portion;

wherein the rear surface of the bottom of the recess portion is exposed for heat dissipation, and a semiconductor element is mounted on the bottom of and within the recess portion; and wherein the stiffener includes a plurality of conductive vias extending through the stiffener, the semiconductor package being stackable with one or more other semiconductor packages to form a multi-layer package arrangement, with the conductive vias enabling grounding and/or thermal conduction between the metallic foils of the packages.

5. The semiconductor package of claim 4, wherein adjacent packages of the multi-layer package are interconnected by solder.

* * * * *